United States Patent
Chu et al.

(10) Patent No.: US 6,922,818 B2
(45) Date of Patent: Jul. 26, 2005

(54) METHOD OF POWER CONSUMPTION REDUCTION IN CLOCKED CIRCUITS

(75) Inventors: Sam Gat-Shang Chu, Austin, TX (US); Joachim Gerhard Clabes, Austin, TX (US); Michael Normand Goulet, Austin, TX (US); Thomas Edward Rosser, Austin, TX (US); James Douglas Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 847 days.

(21) Appl. No.: 09/833,429

(22) Filed: Apr. 12, 2001

(65) Prior Publication Data

US 2002/0152409 A1 Oct. 17, 2002

(51) Int. Cl.[7] .............................................. G06F 17/50
(52) U.S. Cl. ....................... 716/2; 716/4; 716/1; 716/6; 716/18
(58) Field of Search ............................. 716/2, 18, 1, 4, 716/6

(56) References Cited

U.S. PATENT DOCUMENTS

| | | | | |
|---|---|---|---|---|
| 5,508,937 A | * | 4/1996 | Abato et al. ................... 716/6 |
| 5,740,067 A | * | 4/1998 | Hathaway ...................... 716/6 |
| 5,764,525 A | * | 6/1998 | Mahmood et al. ............ 716/18 |
| 6,272,667 B1 | * | 8/2001 | Minami et al. ................ 716/6 |
| 6,272,668 B1 | * | 8/2001 | Teene .......................... 716/10 |
| 6,286,128 B1 | * | 9/2001 | Pileggi et al. ................ 716/18 |
| 6,336,205 B1 | * | 1/2002 | Kurokawa et al. ............ 716/2 |
| 6,425,110 B1 | * | 7/2002 | Hathaway et al. ............ 716/2 |
| 6,440,780 B1 | * | 8/2002 | Kimura et al. .............. 438/129 |

* cited by examiner

*Primary Examiner*—A. M. Thompson
(74) *Attorney, Agent, or Firm*—Duke W. Yee; Mark E. McBurney; Lisa L. B. Yociss

(57) ABSTRACT

A method and apparatus for reducing power consumption of a clocked circuit containing a plurality of latches is provided. A first latch, within the plurality of latches, is located which has more than a predetermined slack. The possibility of substituting an available second latch, that requires less power to operate, is then determined, subject to the constraint that the slack after substitution should still be positive, although it may be less than the predetermined number mentioned above. Where such a possibility is determined to exist, the first latch is then replaced with the available second latch.

27 Claims, 4 Drawing Sheets

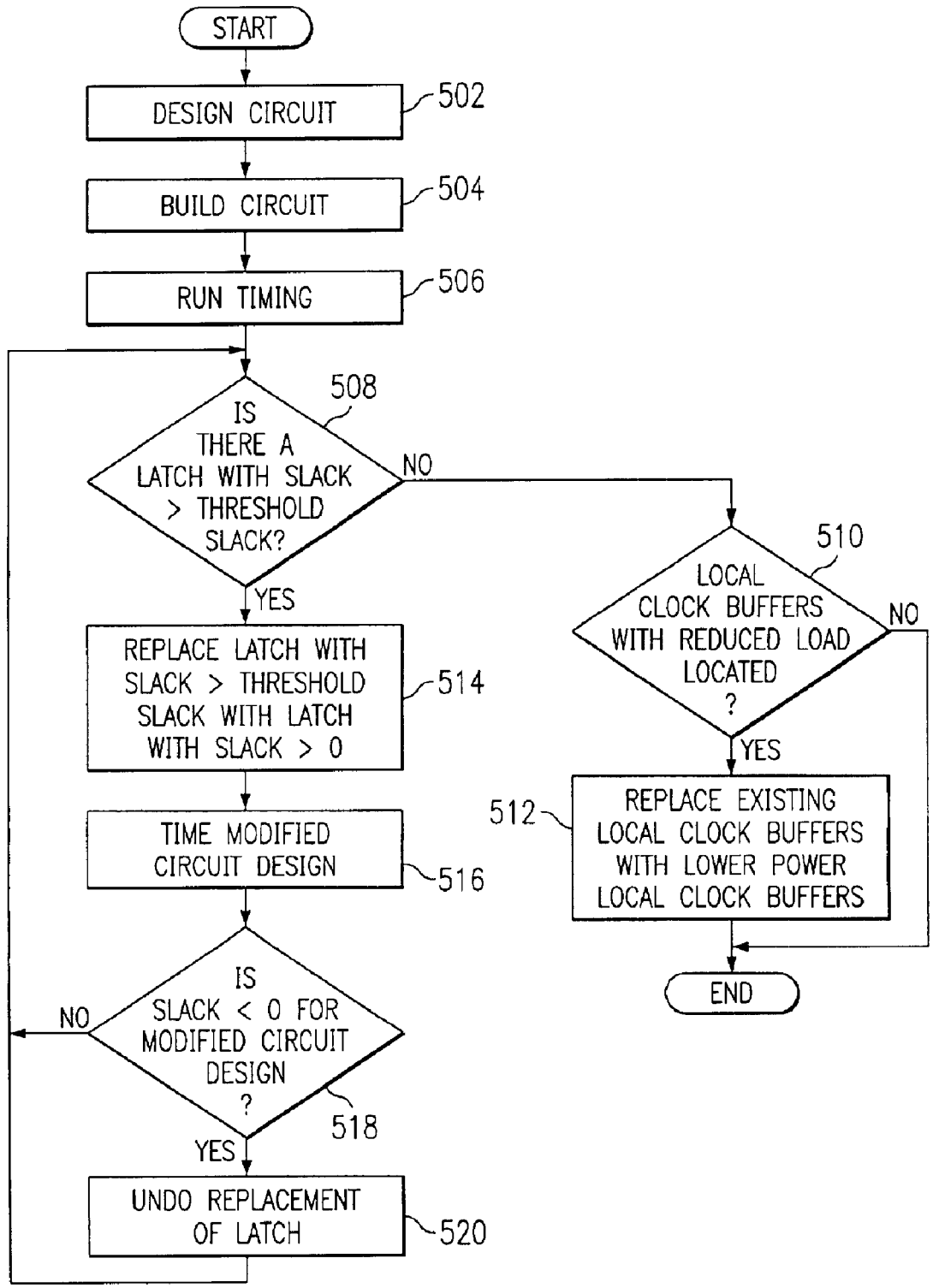

METHOD OF POWER CONSUMPTION REDUCTION IN CLOCKED CIRCUITS

BACKGROUND OF THE INVENTION

1. Technical Field

The present invention relates to electronic circuits, and in particular, to power consumption in electronic circuits.

2. Description of Related Art

As engineers seek ever increasing speeds in VLSI chips, complex problems continue to rise to the forefront. Power consumption in digital logic is dominated by clocks used to control and synchronize circuit operations across a logic domain or an electronic chip. The digital logic consists of circuit elements such as NAND and NOR logic gates and latches being used as clocked gates. VLSI technology continues to advance by increasing the number of circuit elements on VLSI chips and increasing the frequency at which these circuit elements are driven.

The frequency is increased further by reducing the number of logic gates between latches. These methods result in an increased amount of overall power consumption by these circuit elements and an even higher portion taken up by clocked gates. However, only a fraction of these clocked gates are, in any large design, on cycle time limiting paths.

Some prior art power consumption reduction mechanisms have primarily focused on logic reduction and logic gate sizing. However, selective reduction of clock power by substitution of clock gates addresses the main source of power consumption in state-of-the-art digital circuits.

Therefore, it would be advantageous to provide an active circuit that can reduce power consumption, such as is produced by high power consumption clocked gates, and it would be particularly advantageous to provide an active circuit to reduce power consumption by replacing those high power consumption clocked gates with lower power consumption clocked gates without affecting the target cycle time of the circuit.

SUMMARY OF THE INVENTION

The present invention provides a method and apparatus for reducing the power consumption of a clocked circuit containing a plurality of latches. A first latch, within the plurality of latches, is located which has more than a predetermined slack. The possibility of substituting an available second latch (requiring less power to operate) is then determined, subject to the constraint that the slack after substitution should still be positive, although it may be less than the predetermined number mentioned above. Where such a possibility is determined to exist, the first latch is then replaced with the available second latch.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 5 is an exemplary flowchart illustrating the process of power reduction in a clocked circuit by replacing high power latches with low power latches and a high power local clock buffer with a low power local clock buffer in accordance with a preferred embodiment of the present invention.

DETAILED DESCRIPTION OF THE PREFERRED EMBODIMENT

The present invention provides a method and apparatus for power reduction in clocked circuits. The criticality of any clocked gate is identified to a target cycle time objective. A clocked gate with positive slack is replaced with a lower power consumption version of the clocked gate. Latches may have to meet a set slack threshold. Input slack, may be, for example, greater than 100 ps (picoseconds) and output slack, may be, for example, greater than 300 ps. If a latch does have sufficient slack time according to a predetermined slack threshold, this latch may be replaced by a low-power version of the latch. The mechanism of replacing low power latches in and out of a netlist may enable fine tuning of a clocked circuit design after technology mapping and during a timing correction process occurring after the initial physical design.

The clocked gate with the lower power consumption does not adversely affect the target cycle time. The ability to apply this replacement technique of a higher power consuming clocked gate with a lower power consuming clocked gate late in a design process of an electronic circuit maximizes the benefit of reduced power consumption without constraining the design process in the early stages. To minimize impact on a given electronic circuit design, an electrical equivalent and physically compatible replacement clocked gate is provided.

Figure 1:
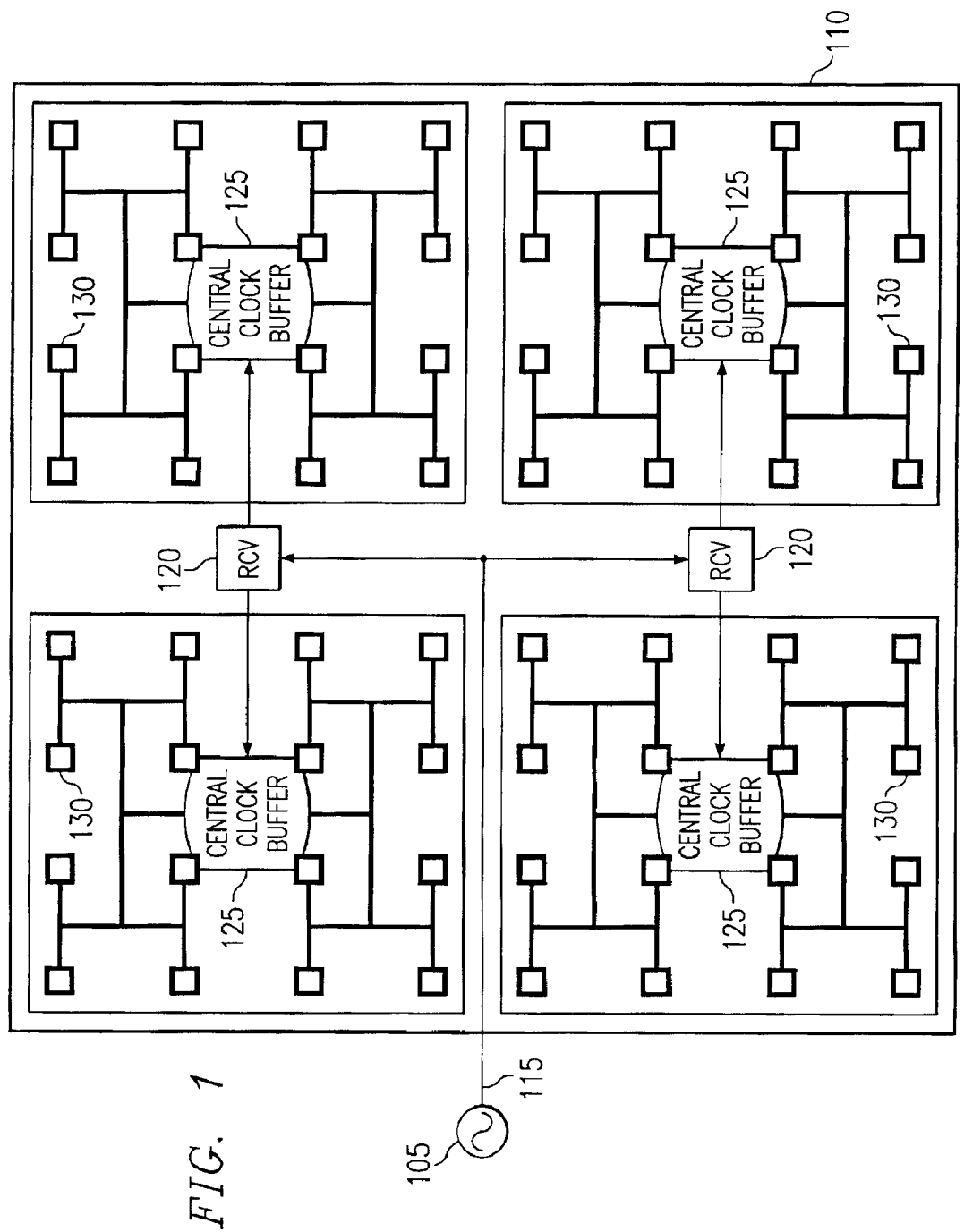
FIG. 1 is a schematic diagram of a clock distribution system in accordance with a preferred embodiment of the present invention.

Referring now to FIG. 1, a schematic diagram of a clock distribution system in accordance with a preferred embodiment of the present invention. A clock source 105 is input into chip 110 from an oscillator source such as a saw-tooth wave generator or a phase-locked loop type clock source by way of wiring 115 on the chip. This oscillator signal is input into two receiver circuits 120. Receiver circuits 120 each drive two central clock buffers 125. Each clock buffer 125 in turn drives an H-tree that terminates with 16 sector buffers 130 used to re-power the clock signal. Each sector buffer 130 then drives a secondary H-tree (not shown) which terminates onto a single clock mesh (not shown), also called a clock grid, covering the entire chip area. The clock mesh is a series of vertical and horizontal low resistive wires that short together the outputs of all the clock buffers of the secondary H-tree, thus minimizing clock skew across the chip.

The clock mesh serves as the clock reference point (mclk) for the chip. The mclk signal is a "free-running" clock signal in that the clock never stops unless there is a problem with the clock source or distribution system. Devices such as latches, dynamic logic, and RAMs tap onto the mesh through local clock buffer circuits which are attached to the mesh. Some devices also connect directly to the mesh without being gated by a local clock buffer. One skilled in the art will recognize that other methods of distributing the clock may be implemented without departing from the scope and spirit of the invention.

Figure 2:
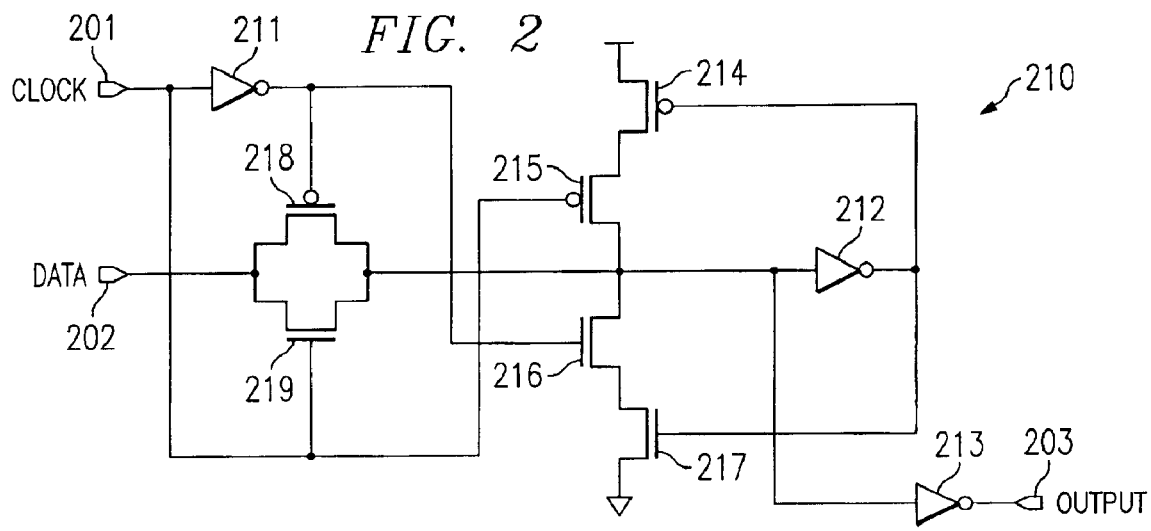
FIG. 2 is a circuit diagram of a latch circuit in accordance with a preferred embodiment of the present invention.

FIG. 2 is a circuit diagram of a latch circuit in accordance with a preferred embodiment of the present invention. Latch circuit 210 includes inverters 211–213 and transistors 214–219. Latch circuit 210 also includes clock signal 201, data input 202, and output 203. The clock load represented by the latches is dependent on the size of the clock gates inside the latch. The data delay through the latch is directly dependent upon the clock gates inside the latch.

Figure 3:
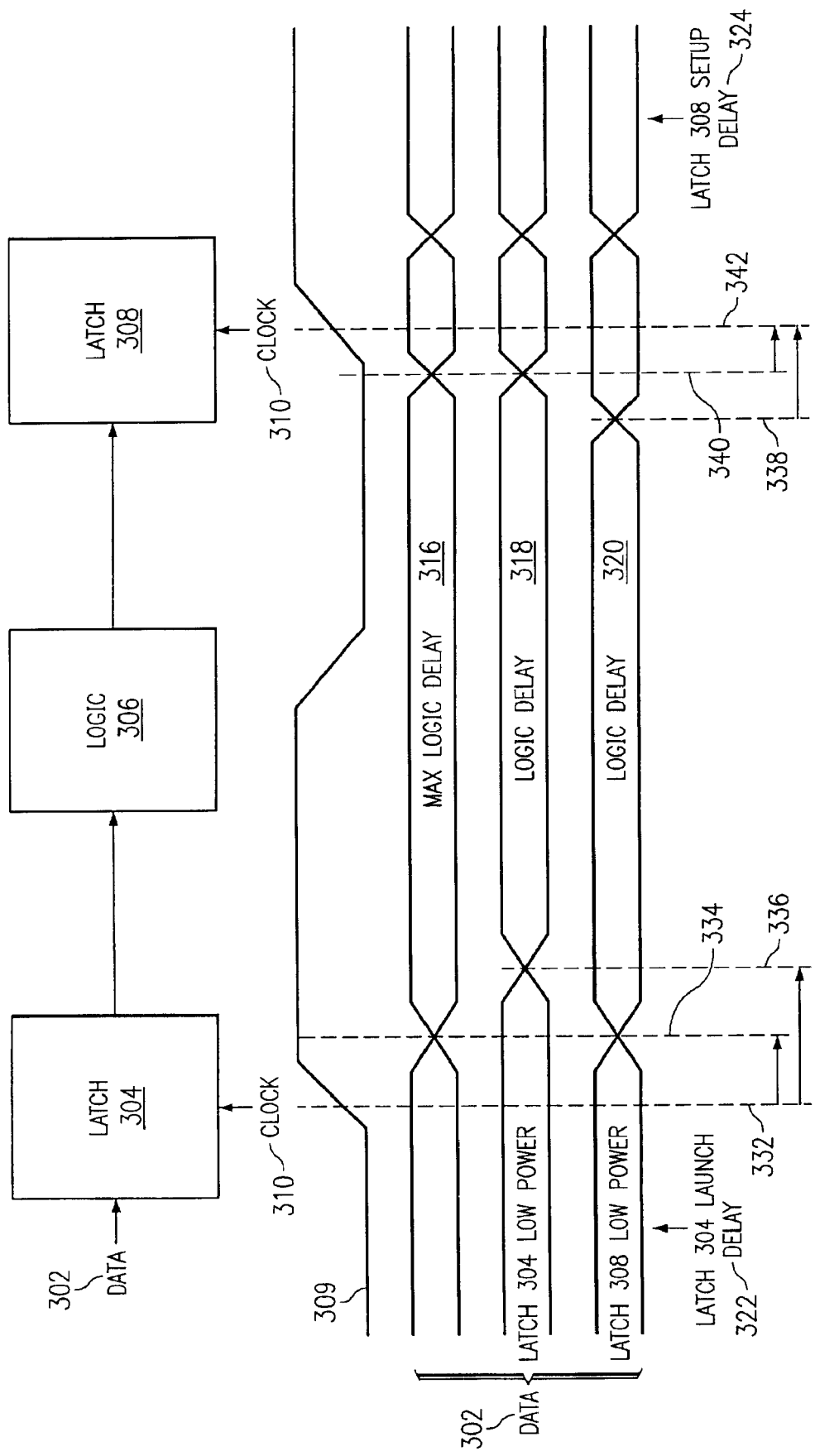
FIG. 3 is an exemplary illustration of the timing constraint for data input into a latch in a clocked circuit in accordance with a preferred embodiment of the present invention.

FIG. 3 is an exemplary illustration of the timing constraint for data input into a latch in a clocked circuit in accordance with a preferred embodiment of the present invention. In this example, data 302 is input into latch 304. When clock signal 310 transitions from low to high, as illustrated by clock signal waveform 309 at point 332, data 302 is sent to logic device 306. Data 302 may remain in logic device 306 for maximum logic delay 316 until 340 before sent to latch 308. As represented by timing diagram the time between points 334 and 340 is the maximum logic delay 316. Therefore, for proper transmission of data 302, data 302 must be transferred between latch 304 and latch 308 within maximum logic delay 316, illustrated by points 334 and 340. Data 302 must be launched from latch 304 by point 334 and be received by latch 308 by point 340.

However, actual logic delay through logic 306 may be smaller than maximum logic delay 316 such that the characteristic of each latch may be altered, for example, latch 304 and 308. Latch 304 may include latch 304 low power with increased launch time represented by the distance between points 334 and 336. Latch 308 may include latch 308 low power with increased setup time represented by the distance between points 338 and 340. Therefore, for proper transmission of date between latch 304, logic device 306 and latch 308, these low power logic delays may be taken into account.

Figure 4:
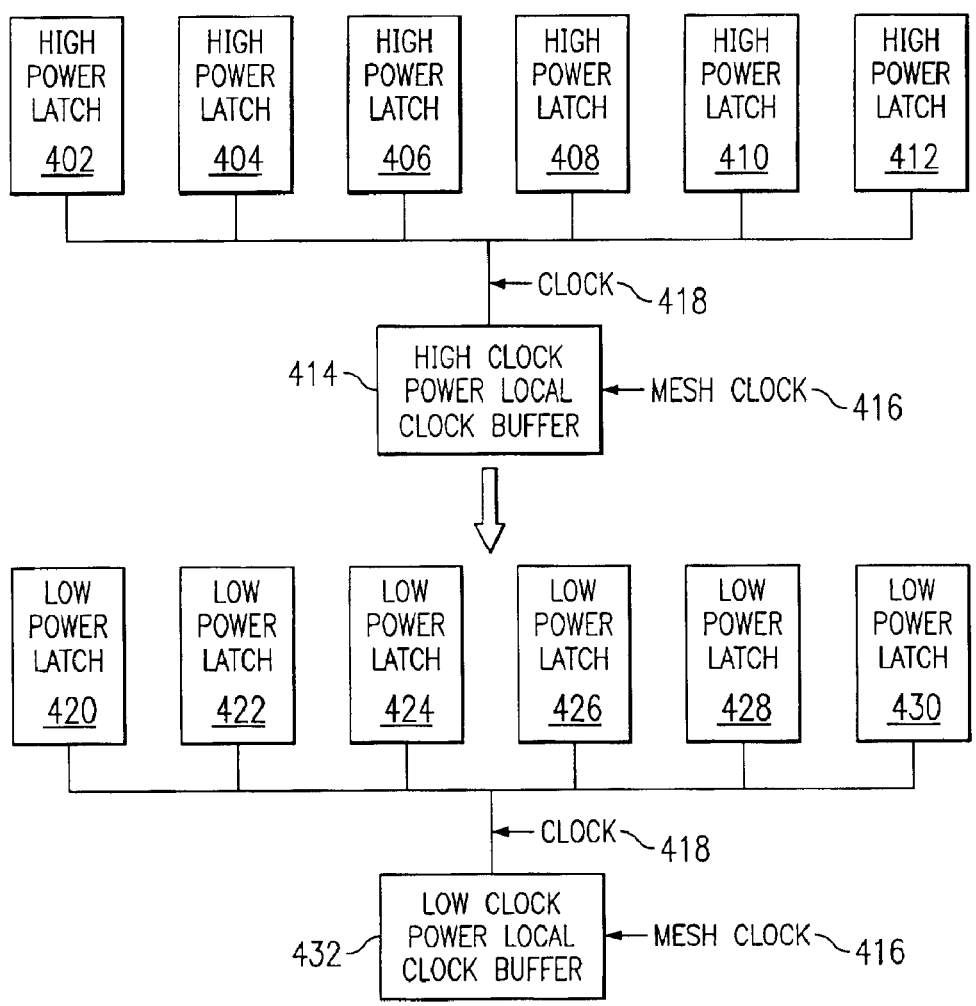
FIG. 4 is an exemplary illustration of a process of power reduction in a clocked circuit by replacing high power latches with low power latches and a high power local clock buffer with a low power local clock buffer in accordance with a preferred embodiment of the present invention.

FIG. 4 is an exemplary illustration of a process of power reduction in a clocked circuit by replacing high power latches with low power latches and high power local clock buffer with low power local clock buffer in accordance with a preferred embodiment of the present invention. In this example, high power latches 402–412 may be replaced by low power latches 420–430. When clock input 418 is input into a clocked circuit, replacement of a high clock power local clock buffer 414 by a low power local clock buffer 432 may complement the process of replacing one or more high power latches 402–412 with one or more low power latches 420–430. As described above in FIG. 1, mesh clock 416 serves as the clock reference point. Devices such as latches 402–412 tap onto the mesh through local clock buffer circuits, such as high clock power local clock buffer 414 which may be attached to the mesh. Based on the availability of a low power latch, one or more of high power latches may be replaced.

A timing procedure is run to test the clocked circuit. A determination is then made as to whether or not any of the latches within the plurality of latches in the clocked circuit has a slack greater than a slack threshold. If there is a latch within the plurality of latches with a slack greater than a slack threshold, then a determination is made as to whether or not this latch can be replaced by an equivalent latch with a slack still greater than zero. Furthermore, a determination is made as to whether or not any of the local clock buffers within the plurality of local clock buffers has upon latch replacement a lowered loading on the clock net example 418 to allow replacement by a low power local clock buffer.

FIG. 5 is an exemplary flowchart illustrating the process of power reduction in a clocked circuit by replacing high power latches with low power latches and a high power local clock buffer with a low power local clock buffer in accordance with a preferred embodiment of the present invention. In this example, the operation begins by designing a clocked circuit (step 502). Then the clocked circuit is built per the design (step 504). The circuit may consist of a plurality logic gates and a plurality of latches. Then a timing procedure is run to test the clocked circuit (step 506). A determination is then made as to whether or not any of the latches within the plurality of latches in the clocked circuit have a slack greater than a threshold slack (step 508). If there is not a latch within the plurality of latches with a slack greater than a threshold slack (step 508:NO), a determination is then made as to whether or not local clock buffers with a reduced load is located (step 510). If local clock buffers with a reduced load is not located (step 510:NO), the operation terminates. If local clock buffers with a reduced load are located (step 510:YES), then the existing local clock buffers are replaced with local clock buffers with a lower power (step 512), and thereafter the operation terminates.

Returning to step 508, if there is a latch within the plurality of latches with a slack greater than a threshold slack (step 508:YES), then the latch with slack greater than the threshold slack is replaced with a latch with a slack greater than zero (step 514). Then the modified circuit design is retimed (step 516). Then a determination is made as to whether or not the slack is less than zero for the modified circuit design (step 518). If the slack is not less than zero for the modified circuit design (step 518:NO), the operation returns to step 510 in which a determination is made as to whether or not there is a latch with a slack greater than the threshold slack. If the slack is less than zero for the modified circuit design (step 518:YES), then replacement of the latch is reversed (step 520) and then the operation returns to step 510 in which a determination is made as to whether or not there is another latch with a slack greater than the threshold slack.

Therefore, the present invention provides a mechanism by which power consumption of an active circuit can be reduced, such as produced by high power consumption clocked gates, and to provide an active circuit to reduce power consumption by replacing those high power consumption clocked gates with lower power consumption clocked gates without affecting the target cycle time of the circuit. If such a replacement is made, the modified circuit is then tested to determine whether the slack of such clocked circuit is still greater than zero. If such condition in the clocked circuit is found, the replacement latch remains in the circuit. However, if the characteristics of the clocked circuit results in slack less than zero, then the replacement latch is taken out of the modified circuit and the original latch reinserted. Upon completion of latch replacement, the load characteristic of all latches driven by a given local clock buffer is evaluated and a lower power level is inserted based on the actual load reduction on, for example, clock net 418 in FIG. 4.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of reducing power consumption of a clocked circuit containing a plurality of latches, the method comprising the steps of:

locating, within the plurality of latches, a first latch in the clocked circuit having more than a predetermined particular positive slack period, said first latch consuming a first amount of power;

determining availability of a second latch having more than a zero slack period and less than said particular slack period, said second latch consuming a second amount of power which is less than said first amount of power; and replacing the first latch with the available second latch.

2. The method as recited in claim 1, wherein the clocked circuit also contains a plurality of local clock buffers, further comprising:

locating, within the clocked circuit, one or mare local clock buffers within the plurality of local clock buffers, wherein a first clock buffer has a reduced clock load;

determining the availability of a second local clock buffer, wherein the second local clock buffer consumes less power; and replacing the first local clock buffer with the available second local clock buffer.

3. The method as recited in claim 2, wherein the first local clock buffer is a high clock power local clock buffer.

4. The method as recited in claim 2, wherein the second local clock buffer is a low clock power local clock buffer.

5. The method as recited in claim 1, wherein replacing the first latch with the second latch forms a modified clocked circuit and further comprising:

testing the modified clock circuit; and responsive to the modified clock circuit failing the test, inserting the first latch back into the clocked circuit.

6. The method as recited in claim 5, wherein a timing test tests the modified clock circuit.

7. The method as recited in claim 1, wherein the first latch is a high power consumption latch.

8. The method as recited in claim 1, wherein the plurality of latches is a plurality of high power consumption latches.

9. The method as recited in claim 1, wherein the second latch is a low power consumption latch.

10. The method of claim 1, wherein the predetermined slack period is at least one of an input slack period and an output slack period.

11. The method as recited in claim 10, wherein the input slack period is greater than 100 picoseconds.

12. The method as recited in claim 10, wherein the output slack period is greater than 300 picoseconds.

13. An apparatus for reducing power consumption of a clocked circuit containing a plurality of latches, comprising:

a first latch;

a timing device; and a second latch, wherein the first latch is located in the clocked circuit having more than a predetermined stack period by the tuning device, availability of the second latch having more than a zero slack period is determined by the timing device, and the first latch being replaced with the available second latch.

14. The apparatus as recited in claim 13, wherein the first latch is a high power consumption latch.

15. The apparatus as recited in claim 13, wherein the second latch is a low power consumption latch.

16. An apparatus for reducing power consumption of a clocked circuit containing a plurality of latches, comprising:

locating means for locating, within the plurality of latches, a first latch in the clocked circuit having more than a predetermined particular positive slack period, said first latch consuming a first amount of power;

determining means for determining availability of a second latch having more than zero slack period and less than said particular slack period, said second latch consuming a second amount of power which is less than said first amount of power; and replacing means for replacing the first latch with the available second latch.

17. The apparatus as recited in claim 16, wherein the clocked circuit also contains a plurality of local clock buffers, further comprising:

locating means for locating, within the clocked circuit, one or more local clock buffers within the plurality of local clock buffers, wherein a first local clock buffer has a reduced clock load;

determining means for determining the availability of a second local clock buffer, wherein the second local clock buffer consumes less power; and replacing means for replacing the first local clock buffer with the available second local clock buffer.

18. The apparatus as recited in claim 17, wherein the first local clock buffer is a high clock power local clock buffer.

19. The apparatus as recited in claim 17, wherein the second local clock buffer in a low clock power local clock buffer.

20. The apparatus as recited in claim 16, wherein replacing the first latch with the second latch forms a modified clocked circuit and further comprising:

testing means for testing the modified clock circuit; and inserting means, responsive to the modified clock circuit failing the test, for inserting the first latch back into the clocked circuit.

21. The apparatus as recited in claim 20, wherein a timing test tests the modified clock circuit.

22. The apparatus as recited in claim 16, wherein the first latch is a high power consumption latch.

23. The apparatus as recited in claim 16, wherein the plurality of latches is a plurality of high power consumption latches.

24. The apparatus as recited in claim 16, wherein the second latch is a low power consumption latch.

25. The apparatus as recited in claim 16, wherein the predetermined slack period is at least one of an input slack period and an output slack period.

26. The apparatus as recited in claim 25, wherein the input slack period is greater than 100 picoseconds.

27. The apparatus as recited in claim 25, wherein the output slack period is greater than 300 picoseconds.

* * * * *

UNITED STATES PATENT AND TRADEMARK OFFICE
CERTIFICATE OF CORRECTION

PATENT NO. : 6,922,818 B2
APPLICATION NO. : 09/833429
DATED : July 26, 2005
INVENTOR(S) : Chu et al.

It is certified that error appears in the above-identified patent and that said Letters Patent is hereby corrected as shown below:

Col. 5, line 56: after "predetermined" delete "stack" and insert --slack--.

Col. 5, line 57: after "by the" delete "tuning" and insert --timing--.

Signed and Sealed this

First Day of August, 2006

JON W. DUDAS
*Director of the United States Patent and Trademark Office*